(12) United States Patent
Raaijmakers et al.

(10) Patent No.: US 7,465,658 B2
(45) Date of Patent: Dec. 16, 2008

(54) OXYGEN BRIDGE STRUCTURES AND METHODS TO FORM OXYGEN BRIDGE STRUCTURES

(75) Inventors: Ivo Raaijmakers, Bilthoven (NL); Pekka J. Soininen, Espoo (FI); Kai-Erik Elers, Helsinki (FI)

(73) Assignee: ASM America, Inc., Phoenix, AZ (US)

( * ) Notice: Subject to any disclaimer, the term of this patent is extended or adjusted under 35 U.S.C. 154(b) by 46 days.

(21) Appl. No.: 11/411,430

(22) Filed: Apr. 25, 2006

(65) Prior Publication Data

US 2006/0258150 A1 Nov. 16, 2006

Related U.S. Application Data

(63) Continuation of application No. 10/696,244, filed on Oct. 28, 2003, now Pat. No. 7,034,397.

(60) Provisional application No. 60/422,614, filed on Oct. 29, 2002.

(51) Int. Cl.
 *H01L 21/4763* (2006.01)
(52) U.S. Cl. .................. 438/627; 438/643; 438/653; 257/E21.584
(58) Field of Classification Search ............... 438/795, 438/798, 627, 643, 653; 257/751, 750, 753, 257/E21.584
 See application file for complete search history.

(56) References Cited

U.S. PATENT DOCUMENTS

| 5,913,144 A | 6/1999 | Nguyen et al. |
| 5,918,150 A | 6/1999 | Nguyen et al. |
| 6,153,515 A | 11/2000 | Murakami et al. |
| 6,348,402 B1 | 2/2002 | Kawanoue et al. |
| 6,362,099 B1 | 3/2002 | Gandikota et al. |
| 6,391,785 B1 | 5/2002 | Satta et al. |
| 6,482,740 B2 | 11/2002 | Soininen et al. |
| 6,492,283 B2 | 12/2002 | Raaijmakers et al. |

(Continued)

OTHER PUBLICATIONS

Chen et al., "The Effect of Surface Oxides on Cu/Ta Interfacial Interactions" *Mat. Res. Soc. Symp. Proc.*, vol. 564, pp. 287-292 (1999).

(Continued)

*Primary Examiner*—Hsien-ming Lee
(74) *Attorney, Agent, or Firm*—Knobbe, Martens, Olson & Bear LLP

(57) ABSTRACT

A method is proposed for improving the adhesion between a diffusion barrier film and a metal film. Both the diffusion barrier film and the metal film can be deposited in either sequence onto a semiconductor substrate. A substrate comprising a first film, which is one of a diffusion barrier film or a metal film, with the first film being exposed at least at part of the surface area of the substrate, is exposed to an oxygen-containing reactant to create a surface termination of about one monolayer of oxygen-containing groups or oxygen atoms on the exposed parts of the first film. Then the second film, which is the other one of a diffusion barrier film and a metal film, is deposited onto the substrate. Furthermore, an oxygen bridge structure is proposed, the structure comprising a diffusion barrier film and a metal film having an interface with the diffusion barrier film, wherein the interface comprises a monolayer of oxygen atoms.

5 Claims, 12 Drawing Sheets

U.S. PATENT DOCUMENTS

| | | |
|---|---|---|
| 6,503,330 B1 | 1/2003 | Sneh et al. |
| 6,551,399 B1 | 4/2003 | Sneh et al. |
| 6,613,695 B2 | 9/2003 | Pomarede et al. |
| 6,727,169 B1 * | 4/2004 | Soininen et al. ............ 438/622 |
| 2002/0004293 A1 | 1/2002 | Soininen et al. |
| 2004/0121620 A1 | 6/2004 | Pomarede et al. |

OTHER PUBLICATIONS

Jennison et al. "Ultrthin Alumnia Film Al-Sublattice Structure, Metal island nucleationat Terrace Point Defects, and How Hydroxylation Affects Wetting," Faraday Discussion #114, pp. 45-52 (1999).

Kelber et al., "Copper watting of $\alpha$-$Al_1O_3$ (0001): theory and experiment," *Surface Science*, 446, pp. 78-88 (2000).

* cited by examiner

OXYGEN BRIDGE STRUCTURES AND METHODS TO FORM OXYGEN BRIDGE STRUCTURES

REFERENCE TO RELATED APPLICATIONS

This application is a continuation of U.S. patent application Ser. No. 10/696,244, filed Oct. 28, 2003 now U.S. Pat. No. 7,034,397. Priority is claimed to U.S. Provisional Application No. 60/422,615, filed Oct. 29, 2002. Each of the priority applications is incorporated herein by reference.

This application is also related to U.S. Pat. No. 6,492,283, issued Dec. 10, 2002 and U.S. patent application Ser. No. 10/281,418, filed Oct. 25, 2002.

FIELD OF THE INVENTION

The invention relates to the manufacturing of integrated circuits, more specifically to the adhesion between metal films and diffusion barrier films.

BACKGROUND OF THE INVENTION

In the current integrated circuit technology, metal films, such as aluminum films and copper films are used as conductors. In conjunction with the metal films, diffusion barrier films are used to avoid diffusion of the metal atoms into other areas of the integrated circuit, such as insulators or active areas, which would have a detrimental effect on the functioning of the circuit. A major problem with the prior art relating to the deposition of metal films on diffusion barrier films or the deposition of diffusion barrier films on metal films is a poor adhesion between the two types of films. In particular, when the second film is deposited by chemical vapor deposition (CVD), the adhesion is problematic. In some cases a deposited metal film may even form a discontinuous coating on a diffusion barrier due to the rapid surface diffusion of the metal. This is particularly problematic for copper films. Although copper is solid at the processing temperatures, the very high diffusion rate of copper atoms results in the formation of copper islands on the diffusion barrier. It seems that copper has high interfacial tension and it is difficult to keep copper in continuous film form.

There have been different types of solutions to the adhesion problem. Srinivas Gandikota et. al. teach in a U.S. Pat. No. 6,362,099 that the barrier surface must be completely free from the presence of oxygen atoms because, according to Gandikota et. al., an oxidized barrier surface causes poor adhesion of copper to the barrier. Even when the interface is kept completely free of oxygen, the adhesion of a copper film onto a diffusion barrier film is not always adequate.

Thick layers of barrier metal oxides, such as $TiO_2$ and $Ta_2O_5$, may also cause problems because uncontrolled oxidation of diffusion barriers forms metal oxides that have low density.

It is known that thick copper oxide layers cause adhesion problems because copper oxides are rather soft and they delaminate easily under mechanical stress. Failures in techniques known in the art are possibly caused by the uncontrolled growth of a relatively thick copper oxide layer at the diffusion barrier/copper interface.

In U.S. patent application publication No. 2002/0004293A1 of applicant it is proposed to deposit a copper oxide film onto a barrier film and then reduce the copper oxide film to copper by exposure to an alcohol vapor. This method appeared to be effective and the alcohol vapor reduced the copper oxide film effectively throughout the whole film down to the interface with the diffusion barrier with little or no oxygen left in the copper film. However, this method requires an extra copper reduction step. Further, this method does not provide a solution for the opposite sequence, when a diffusion barrier film needs to be deposited onto a metal film.

It is the objective of the present invention to avoid the disadvantages above and to provide a method and process to achieve a good adhesion between metal films and diffusion barrier films.

SUMMARY OF THE INVENTION

In accordance with one aspect of the invention, an oxygen bridge structure of oxygen atoms is created between a metal film and a diffusion barrier film to improve the adhesion between the metal film and the diffusion barrier film. This oxygen bridge structure is created by exposing a first film, which is either a diffusion barrier film or a metal film, to an oxygen-containing reactant. In one embodiment, about a monolayer of oxygen-containing groups or oxygen atoms is chemisorbed onto the exposed surface of the first film. In certain embodiments, a plurality of steps accompany the exposure to the oxygen-containing reactant. After exposure to the oxygen-containing reactant, a second film is deposited onto the first film, the second film being the other one of a metal film and a diffusion barrier film. The oxygen-containing groups or oxygen atoms function as attachment sites for the second film, each oxygen atom acting as a bridge between a metal film atom and a diffusion barrier film atom.

In accordance with another aspect of the invention, a method is provided for manufacturing a semiconductor device. The method includes providing a semiconductor substrate and depositing a diffusion barrier onto the substrate by ALD. The substrate is then exposed to an oxygen-containing reactant to create a surface termination of about one monolayer of oxygen-containing groups or oxygen atoms on the diffusion barrier. A metal film is then deposited on the substrate.

In accordance with another aspect of the invention, an oxygen bridge structure is provided. The structure includes a diffusion barrier film and a metal film, having an interface with the diffusion barrier film. About a monolayer of oxygen atoms is at the interface between the diffusion barrier film and the metal film. The oxygen atoms form bridges between diffusion barrier film atoms and metal film atoms.

In accordance with another aspect of the invention, a conductive pathway in an integrated circuit is provided. The pathway includes a diffusion barrier film that includes a material selected from the group consisting of metal nitrides, metal carbides, metal phosphides and metal borides. A metal conductor is positioned adjacent the diffusion barrier film. A metal oxide bridge material is sandwiched between the diffusion barrier film and the metal conductor, where the bridge material has a thickness of no more than about five monolayers.

DETAILED DESCRIPTION OF THE PREFERRED EMBODIMENT

Typically, transition metal nitrides such as TiN, TaN, WN, NbN and HfN are used as diffusion barriers. Further examples of possible diffusion barrier materials are metal carbides (such as tungsten carbides, e.g., WC), SiC, transition metal borides, such as tantalum boride TaB and titanium boride TiB, transition metal phosphides, such as titanium phosphide $Ti_2P$ and tungsten phosphide WP, and various combinations of the above. Also pure metals such as W and Ta are in use as diffusion barriers.

It is known that copper atoms bind weakly with nitrogen atoms. For example, copper nitride decomposes at temperatures as low as 300° C. with the formation of elemental copper and release of nitrogen gas. Further, the chemical bond between copper and carbon is also very weak, and copper carbides are not stable. In fact, copper acetylide ($Cu_2C_2$) is explosive. Similarly, the chemical bond between copper and boron or phosphorus is weak.

On the other hand, the bond strengths between copper and the group VI-A elements oxygen, sulfur and selenium are much higher, with the bond strength between oxygen and copper being the highest. For reference, the bond strength between two copper atoms is given to be 201 kJ/mol, whereas the bond strengths between copper and oxygen, sulfur and selenium are 343 kJ/mol, 293 kJ/mol and 285 kJ/mol, respectively. Consequently, it was found that the adhesion of a copper film on a diffusion barrier film is improved by the presence at the interface of about one monolayer of group VI-A atoms and in particular about one monolayer of oxygen atoms. Oxygen acts as a bridging atom between the diffusion barrier film and the copper film.

When depositing a diffusion barrier film directly onto a metal film, similar adhesion problems will occur as with the deposition of a metal film directly on a diffusion barrier film. The methods of the preferred embodiments are applicable to any diffusion barrier film/metal film interface, irrespective of the sequence of deposition.

Figure 1:
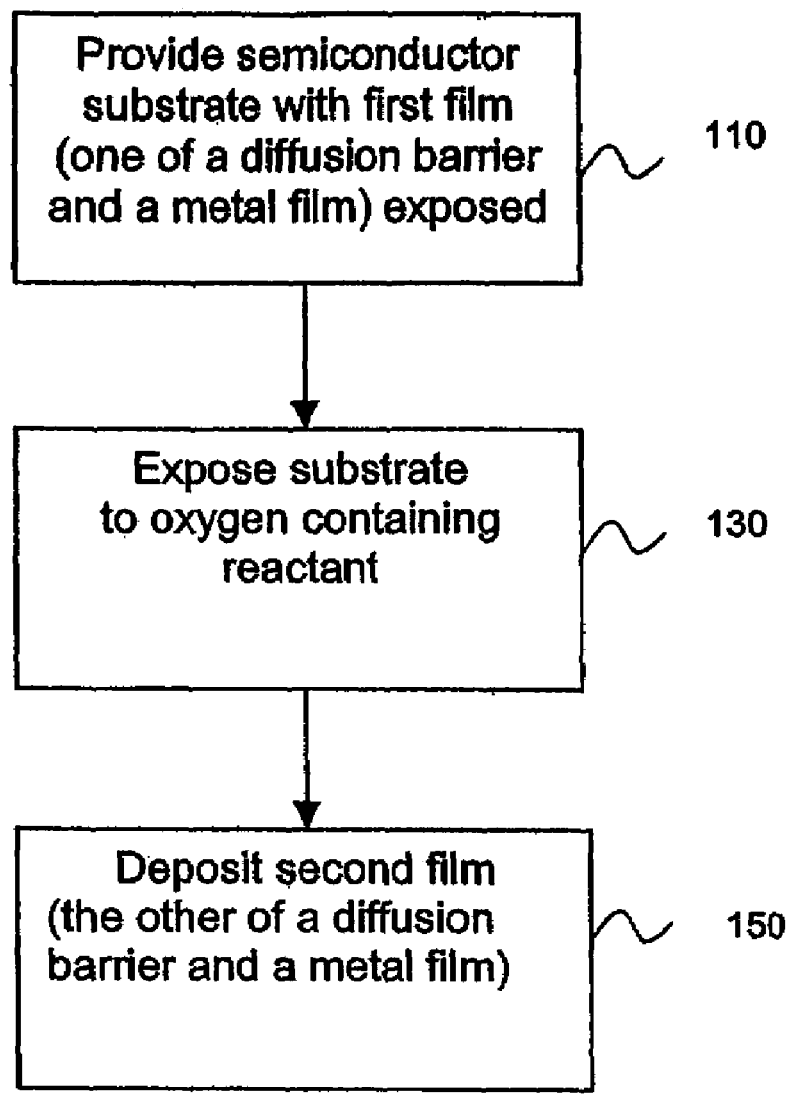
FIG. 1-5 are block diagrams showing methods in accordance with embodiments of the present invention.

The methods according to the preferred embodiments are schematically represented in FIG. 1. In a first step 110, a semiconductor substrate is provided comprising a first film, which is one of diffusion barrier and a metal film. The first film can be deposited by techniques such as chemical vapor deposition (CVD), atomic layer deposition (ALD), physical vapor deposition (PVD) or sputtering and, in case of a metal film by electrochemical deposition (ECD). The first film is exposed at least at part of the surface area of the semiconductor substrate. In a next step 130, the substrate is exposed to an oxygen-containing reactant to create a surface termination of about one monolayer of oxygen-containing groups or oxygen atoms on the exposed parts of the first film. The oxygen-containing reactant can be ozone, atomic oxygen or another oxidizing reactant. The oxygen-containing reactant can also be a hydroxyl-containing reactant, such as water, or an alcohol, such as methanol, ethanol, propanol or other alcohol materials. Furthermore, other organic hydroxyl-containing materials can be used such as formic acid, acetic acid or other carboxylic acids. Alternatively a plasma, formed from $H_2$ and $O_2$, can be used to create energetic OH species.

The oxygen-containing reactant exposure step 130 should be designed such that a termination of about one monolayer of oxygen atoms or oxygen-containing groups is formed on the surface of the exposed parts of the first film. "About one monolayer," as used herein, refers to a surface termination between 0.25 monolayer to one monolayer, i.e., where one monolayer designates full coverage of all available surface sites. Then, in a next step 150 a second film is deposited, being the other one of a diffusion barrier and a metal film. The deposition of the second film can be carried out by CVD, ALD, PVD or sputtering but is preferably carried out by a CVD or ALD technique.

Figure 2:
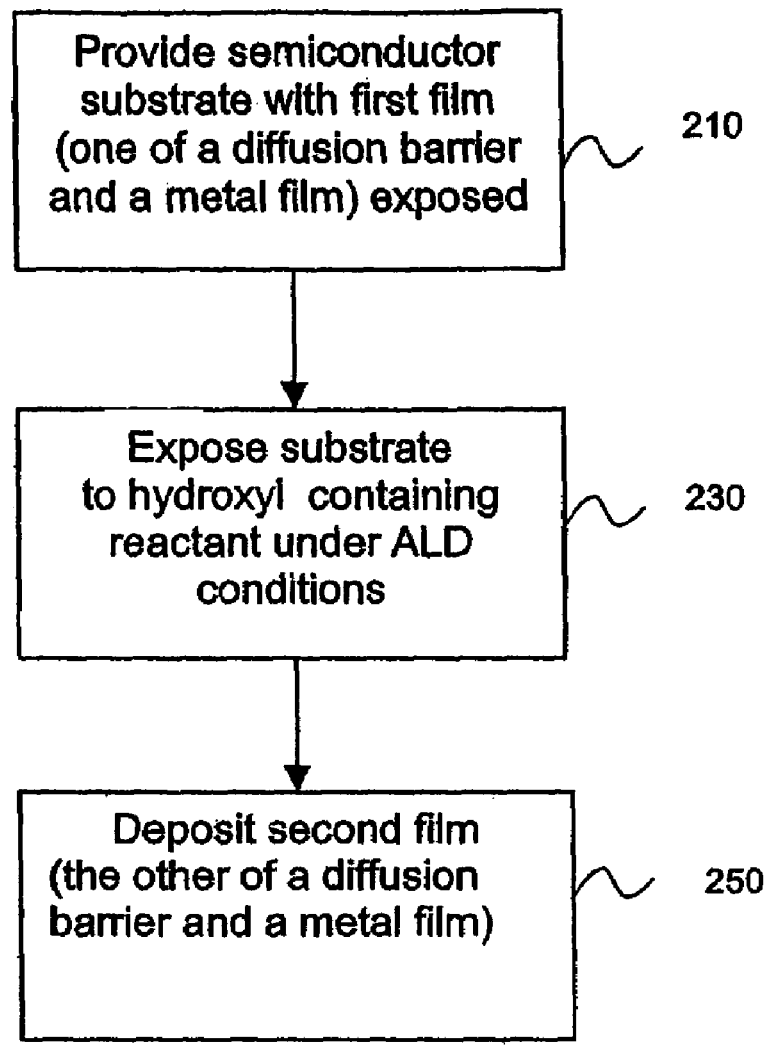

Another embodiment of the invention is shown in FIG. 2. In a first step 210, a semiconductor substrate is provided comprising a first film, being one of diffusion barrier and a metal film. The first film is exposed at least at part of the surface area of the semiconductor substrate. In a next step 230, the substrate is exposed to a hydroxyl-containing reactant (a species of oxygen-containing reactant) under ALD conditions. By "under ALD conditions" is meant that the reactant does not form a condensed liquid or solid layer on the surface, neither thermally decomposes but rather chemisorbs onto the surface, where each one of a plurality of hydroxyl-containing reactant molecules leaves behind a chemisorbed hydroxyl group on the surface of the substrate. The exposure step 230 should be designed such that after its completion the exposed part of the first film is terminated with about one monolayer of hydroxyl groups. Then, in a next step 250 a second film is deposited, being the other one of a diffusion barrier film and a metal film. The deposition of the second film can be carried out by CVD, ALD, PVD or sputtering but is preferably carried out by a CVD or ALD technique.

According to a particular arrangement of the embodiment of the invention according to FIG. 2, the first film is a diffusion barrier film and a carbon, nitrogen, phosphorus or boron rich surface ("or" is used in the inclusive sense) of the diffusion barrier is provided with a termination of about a monolayer of oxygen-containing groups or oxygen atoms prior to the deposition of the metal film. Preferably, the metal film comprises copper, copper alloys or copper compounds. To achieve this oxygen termination, the nitride, carbide, phosphide and/or boride surface is treated with a gaseous reactant that contains oxygen, and preferably contains a hydroxyl group. A suitable hydroxyl-containing reactant is water. Subsequently the copper film is deposited onto the surface, thereby converting the hydroxyl groups or other oxygen-containing groups or oxygen atoms of the surface termination into oxygen atomic bridges, wherein an oxygen atom acts as an adhesion-improving bridge between a diffusion barrier atom and a copper atom.

Figure 3:
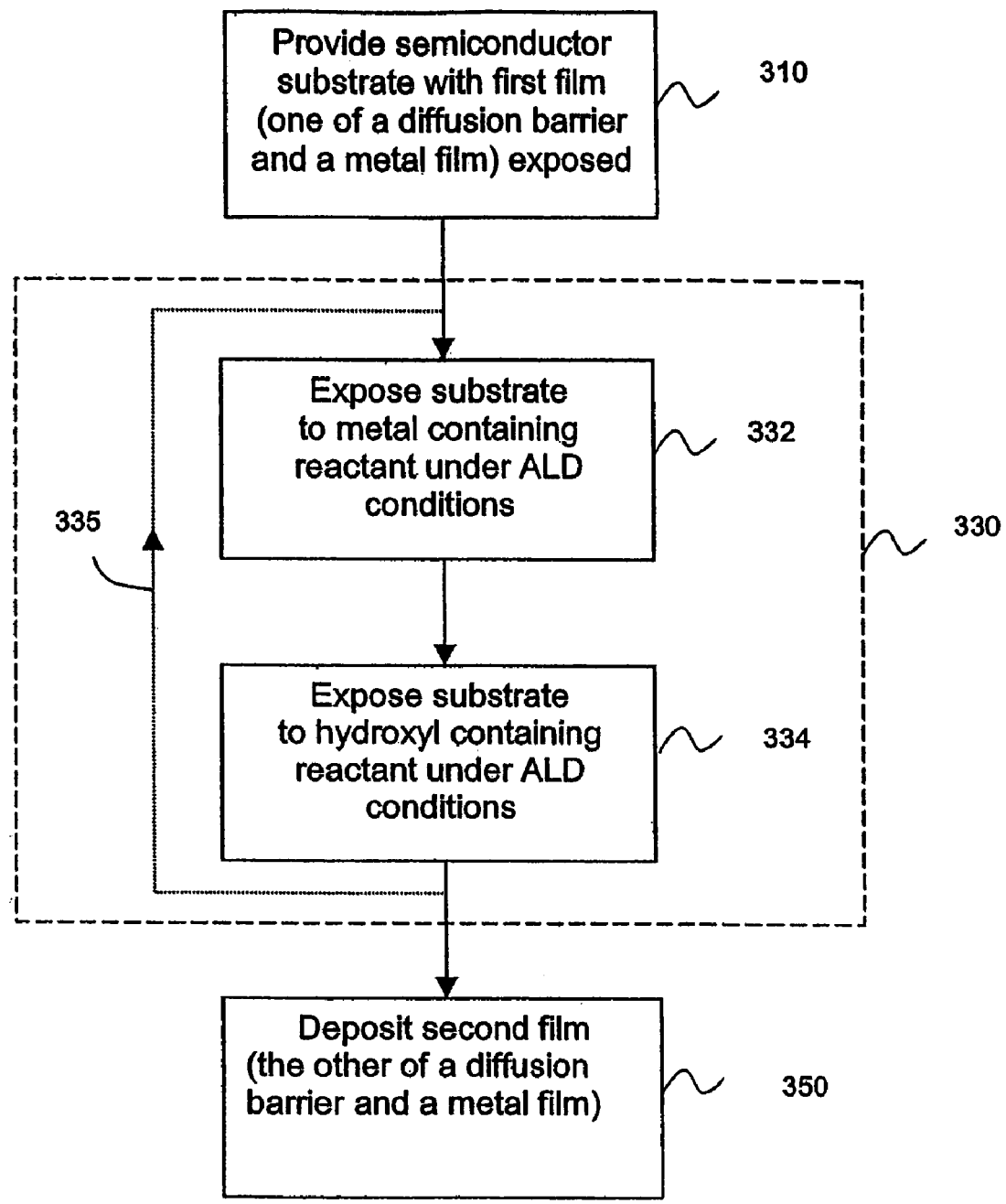

Yet another embodiment of the method according to the invention is shown in FIG. 3. This embodiment addresses a situation wherein the chemisorption of the hydroxyl-containing reactant proceeds slowly or very incompletely due to inertness of the surface of the first film. In a first step 310 a semiconductor substrate is provided comprising a first film, which is one of a diffusion barrier and a metal film. The first film is exposed at least at part of the surface area of the semiconductor substrate. In a next step 330, the substrate is exposed to a hydroxyl-containing reactant under ALD conditions. To overcome the inertness of the surface of the first film, step 330 now comprises a first step 332 wherein the substrate is exposed to a metal-containing reactant under ALD conditions and a second step 334 wherein the substrate is exposed to a hydroxyl-containing reactant. The surface of the first film can be so inert that step 332 and 334 should be repeated a number of times as indicated by loop 335. The number of cycles required to achieve about a monolayer coverage of hydroxyl groups on the first film surface can vary from one to fifty, the latter number applicable for first film surfaces that are inflicted with a long inhibition time for chemisorption. An example of a film surface that is inflicted with a long inhibition time is a silicon carbide film surface. In fact, step 330 indicates the deposition of about a monolayer of metal oxide by ALD. Then in step 350 the second film is deposited, being the other one of a diffusion barrier film and a metal film. The deposition of the second film can be carried out by CVD, ALD, PVD or sputtering but is preferably carried out by a CVD or ALD technique.

In the method according to FIG. 3, using a repeated sequence of a metal-containing reactant exposure step 332 and a hydroxyl-containing reactant exposure step 334, it will be understood that a plurality of monolayers of metal oxide can be deposited, the number of monolayers preferably being less than 5 and more preferably less than 3. In particular, when the metal oxide is conductive, metal oxide film of aforementioned thickness will not significantly contribute to the electrical resistance of the interface. When using a combination of a metal-containing reactant and a hydroxyl-containing reactant, the hydroxyl-containing reactant exposure step 334 following the metal reactant exposure step 332, the surface termination of the metal oxide interfacial film will be a hydroxyl termination according to the present invention. In such arrangements, less than about a monolayer of surface termination is formed during each cycle of the process, but the bridge material can be considered to include a plurality of monolayers of metal oxide.

Figure 4:
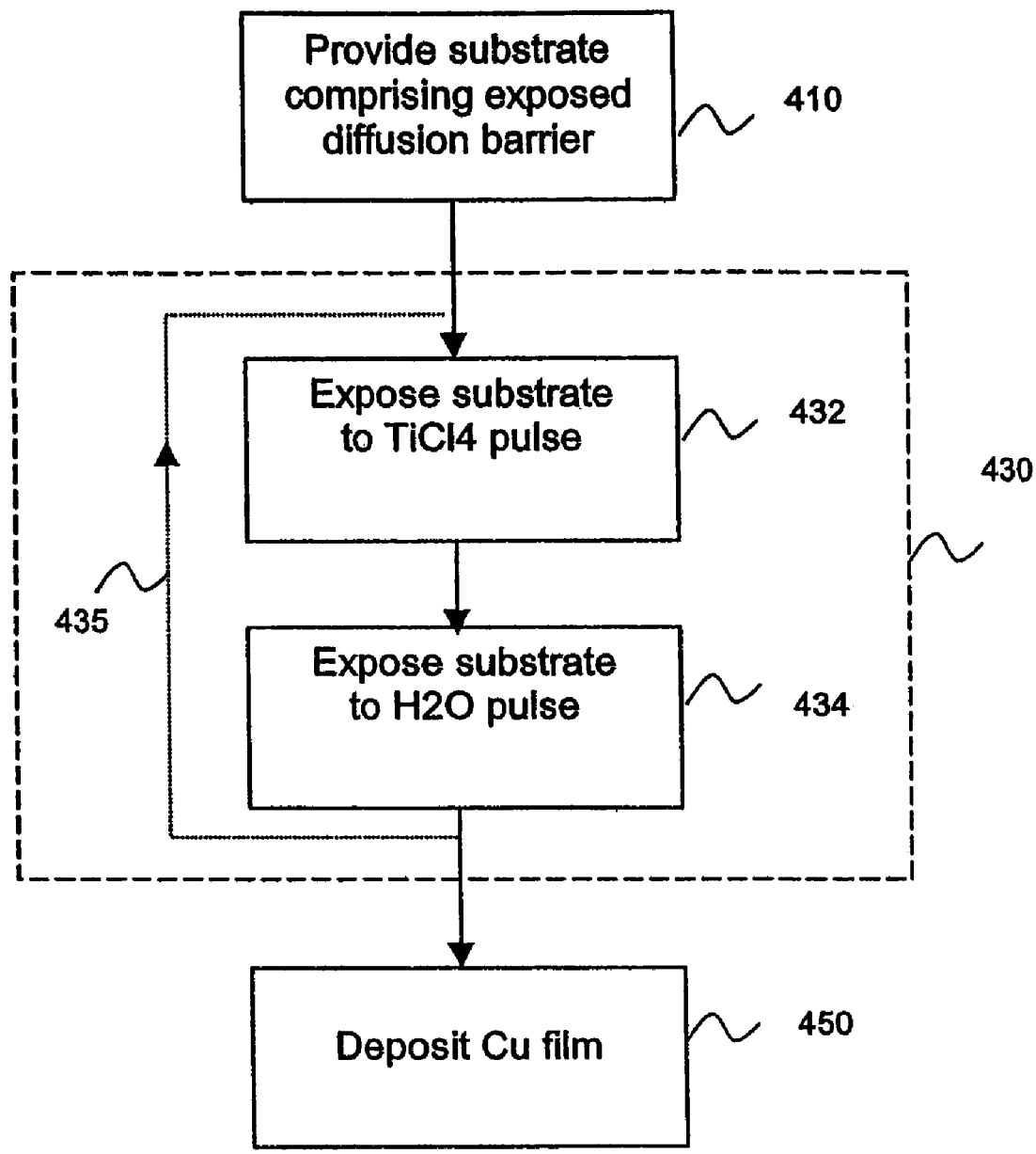

FIG. 4 illustrates a specific example of the method according to FIG. 3. In step 410 a semiconductor substrate is provided comprising a diffusion barrier, the diffusion barrier being exposed at least at part of the surface area of the substrate. In a next step 430, about a monolayer of titanium oxide is deposited. Step 430 comprises a first step 432 wherein the substrate is exposed to $TiCl_4$ under ALD conditions. In a next step 434 the substrate is exposed to water vapor under ALD conditions. Steps 432 and 434 are repeated one to fifty times, as indicated by loop 435, until about a monolayer of hydroxyl-terminated titanium oxide is formed, the hydroxyl groups being attached to titanium atoms. Then in step 450 a copper film is deposited by a known method, preferably by CVD or ALD. Upon exposure of the hydroxyl-terminated titanium oxide surface with the copper source material used, a copper source molecule can react with a hydroxyl group, so that a bond between a copper atom and the oxygen atom of the hydroxyl group forms while the oxygen atom remains attached to a titanium atom. The hydrogen atom is released from the hydroxyl group and forms a bond to a ligand in the copper source molecule, e.g. acetylacetonate acac, in forming a gaseous byproduct molecule, in this case acetylacetone Hacac, and is exhausted.

Figure 5:
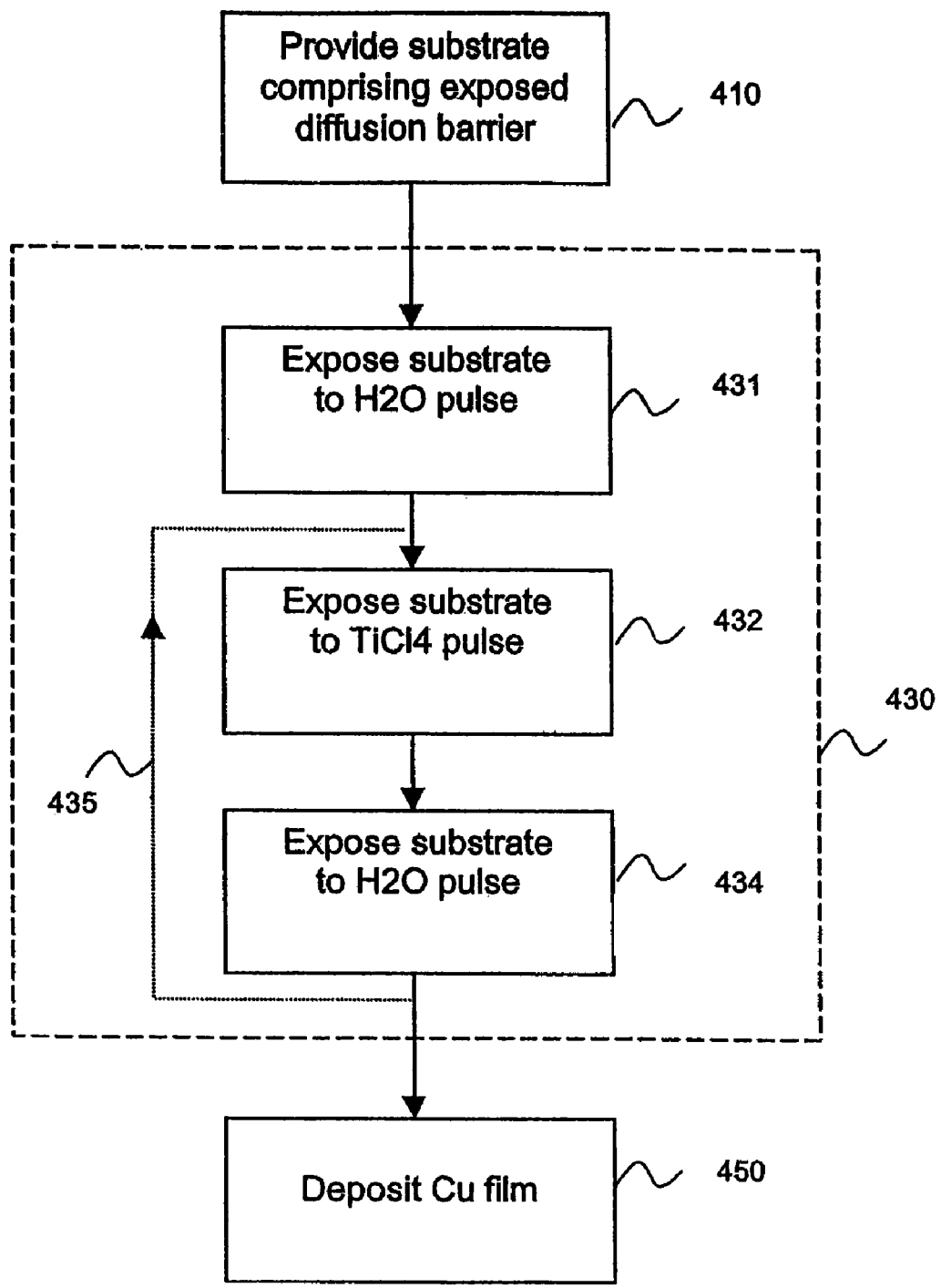

FIG. 5 illustrates an example of the method according to FIG. 3. In FIG. 5 like reference numerals refer to similar steps as in FIG. 4. In FIG. 5, step 430 starts with step 431 wherein the substrate is exposed to water vapor.

Below, Examples 1-3 of the surface engineering are given wherein the first film is a diffusion barrier and the second film is copper.

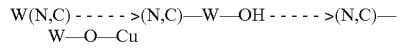

Ex. 1

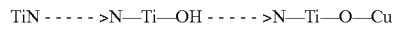

Ex. 2

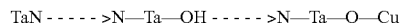

Ex. 3

In Example 1, a tungsten nitride carbide surface is converted into a hydroxyl-terminated surface by exposure to an oxidizing agent, e.g., water and/or ozone and/or hydroxyl radicals. When the hydroxyl-terminated surface is exposed to a copper source chemical, a strong bond forms between oxygen and copper.

In Example 2, a titanium nitride surface is converted into a hydroxyl-terminated surface by exposure to an oxidizing agent, e.g., water, ozone and/or hydroxyl radicals. When the hydroxyl-terminated surface is exposed to a copper source chemical, a strong bond forms between oxygen and copper.

In Example 3, a tantalum nitride surface is converted into a hydroxyl-terminated surface by exposure to an oxidizing agent, e.g., water, ozone and/or hydroxyl radicals. When the hydroxyl-terminated surface is exposed to a copper source chemical, a strong bond forms between oxygen and copper. Copper metal deposition can then be continued on the oxygen-bonded copper surface and the resulting copper metal film has good adhesion on the underlying diffusion barrier surface.

Although in the examples described above, copper is mentioned as the metal of choice, the method according to the invention is also applicable to depositing other metals, such as aluminum, Ni, Co and Ru, onto barrier materials. Some of these metals can also be used as seed layers for copper deposition.

Some more specific examples of the method according to FIG. 3 will now be described below. In these examples the first layer is a diffusion barrier film, and more particularly TiN or another transition metal nitride. The metal in the metal-containing reactant preferably forms strong bonds with both oxygen and nitrogen. The deposited metal oxide(s) is (are) preferably electrically conductive, although it is possible to use insulating oxides (e.g., $Al_2O_3$) as well, because the oxide layer is so thin that it hardly contributes to electrical resistance. For example, tin oxide, titanium oxide, tantalum oxide or tungsten oxide is deposited by ALD on the diffusion barrier surface.

One special benefit of the ALD method is that the growth rate of the films can be so small that several pulsing cycles may be needed before forming a total molecular layer of a thin film. For example, aluminum isopropoxide has bulky isopropoxide ligands that reserve surface space when the aluminum isopropoxide is chemisorbing on the surface. Aluminum atoms cannot touch each other on the surface because of this kind of steric hindrance. When the isopropoxide-terminated surface has been oxidized into aluminum oxide that has hydroxyl groups, the average thickness of the added aluminum oxide layer is about ⅓-⅕ of the lattice constant of aluminum oxide. This means that after one pulsing cycle there is plenty of surface area free of insulating oxide, after two pulses there is still some surface area free of insulating oxide, and so on until the surface becomes totally covered with insulating oxide. In view of the present disclosure, the skilled artisan can readily optimize the number of ALD deposition cycles so that enough oxygen bridges can be created on the surface but the surface is still not too insulating and the contact resistance between the diffusion barrier film and the metal film is low enough for suitable circuit function. The skilled artisan will appreciate that less than a full monolayer can nevertheless provide adequate adhesion, while more than a monolayer can nevertheless avoid excessive resistance.

Examples of the surface engineering are shown hereafter. The left-hand-side of the structure belongs to the diffusion barrier side (db) and the right-hand-side of the structure belongs to the metal or seed layer side (met).

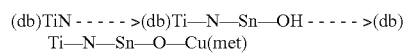

Ex. 4

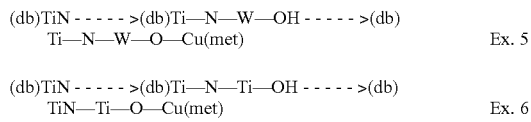

(db)TiN - - - - - >(db)Ti—N—W—OH - - - - - >(db)
　　　Ti—N—W—O—Cu(met)　　　　　　　Ex. 5

(db)TiN - - - - - >(db)Ti—N—Ti—OH - - - - - >(db)
　　　TiN—Ti—O—Cu(met)　　　　　　　Ex. 6

In Example 4 titanium nitride surface is first exposed to a tin source chemical pulse (e.g., tin tetrachloride SnCl$_4$) and then the chloride-terminated surface is exposed to an oxygen-containing source chemical pulse (e.g., water or H$_2$O), forming a hydroxyl-rich surface so that hydroxyl groups terminate the surface. The hydroxyl-terminated surface is reactive and makes it possible to bond copper metal atoms to the surface.

In Example 5, the titanium nitride surface is first exposed to a tungsten source chemical pulse (e.g., tungsten hexafluoride or WF$_6$) and then the fluoride-terminated surface is exposed to an oxygen-containing source chemical pulse (e.g., water or H$_2$0), forming a hydroxyl-rich surface. The hydroxyl-terminated surface is reactive and makes it possible to bond copper metal atoms to the surface.

In Example 6, the titanium nitride surface is first exposed to a titanium source chemical pulse (e.g., titanium tetrachloride or TiCl$_4$) and then the chloride-terminated surface is exposed to an oxygen-containing source chemical pulse (e.g., water or H$_2$O), forming a hydroxyl-rich surface. The hydroxyl-terminated surface is reactive and makes it possible to bond copper metal atoms to the surface.

Figure 6:
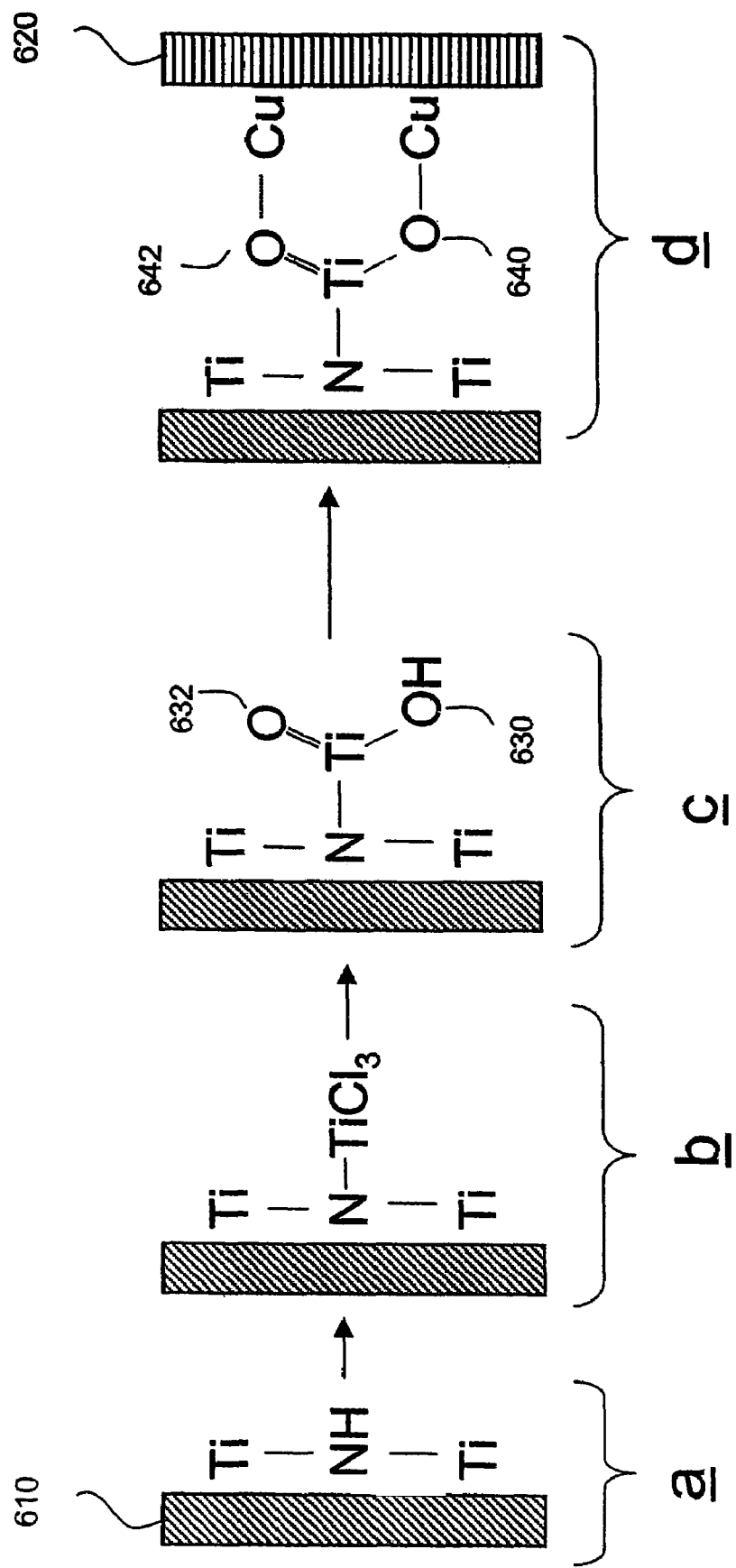
FIGS. 6 and 7 are schematic representations of surface chemistries during steps of certain embodiments of the present invention.

The surface chemistry of Example 6 is schematically represented in FIG. 6. In FIG. 6 $a$ the starting position is shown, wherein the surface of the TiN film 610 comprises NH groups, which is typically the case when the TiN film deposition is terminated with an NH$_3$ exposure step. In FIG. 6 $b$ the surface is shown after TiCl$_4$ exposure, the TiCl$_4$ molecules reacting with the hydrogen termination of the N atoms and leaving the surface with a TiCl$_3$ termination. In FIG. 6 $c$, the surface is shown after water vapor exposure, the water vapor hydrolyzing the TiCl$_3$ termination and leaving the surface with a termination of hydroxyl groups 630 and double bonded oxygen 632. In FIG. 6 $d$ the substrate is shown after copper film deposition, showing strong oxygen bridges 640, resulting from the hydroxyl groups 630, and weaker oxygen bridges 642, resulting from the double bonded oxygen 632.

Figure 7:
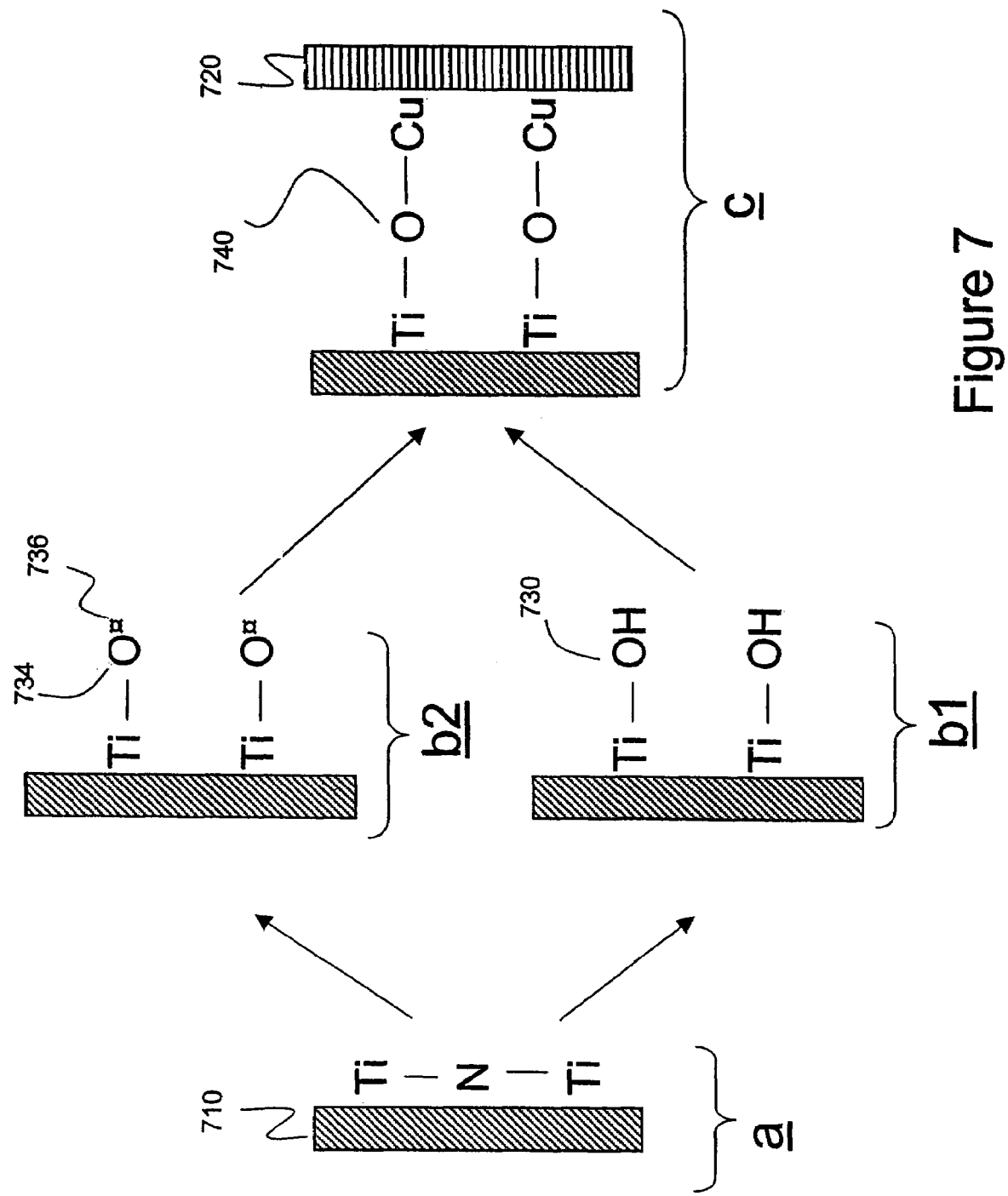

FIG. 7 shows schematically the surface chemistry in a slightly different scheme, applied to a TiN diffusion barrier film 710. In FIG. 7$a$, the starting situation is represented. The nitrogen atoms are now removed and replaced by oxygen-containing atoms or groups. In FIG. 7 $b$1, after exposure to a hydroxyl-containing reactant, hydroxyl groups 730 replace the nitrogen atoms. In alternative FIG. 7 $b$2, after exposure to a suitable oxidant such as ozone, oxygen atoms 734 replace the nitrogen atoms. The ozone exposure step should be controlled so that a surface termination of about one monolayer of oxygen atoms is achieved, the oxygen atoms comprising a dangling bond 736. In FIG. 7 $c$, the substrate is shown after deposition of the copper film 720, wherein either the hydroxyl groups 730 or the oxygen atoms 734 are converted into oxygen bridges 740.

Figure 8:
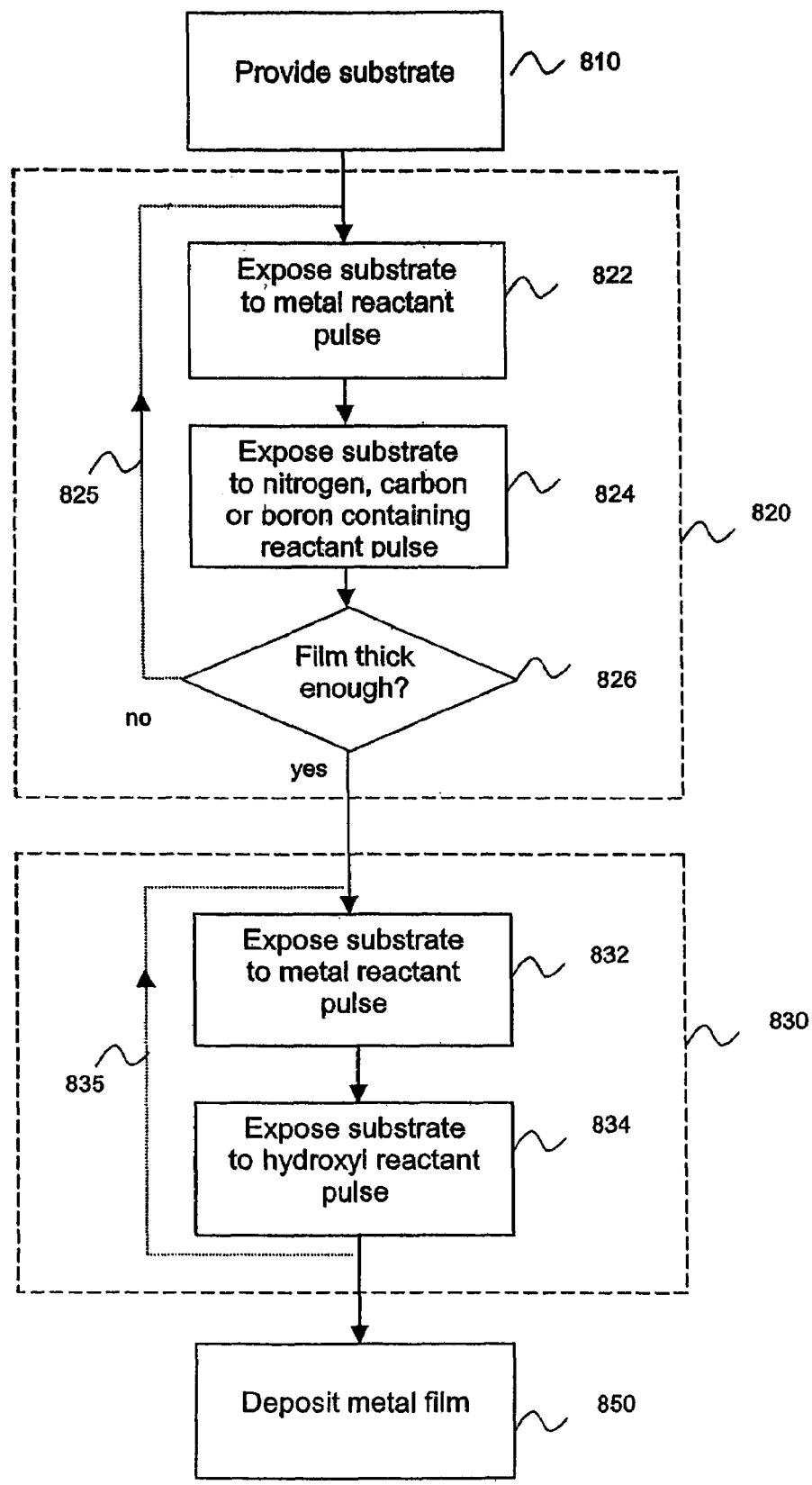
FIGS. 8 and 9 are block diagrams of further embodiments of methods according to the present invention.

FIG. 8 shows a preferred embodiment of the invention wherein the first film is a diffusion barrier deposited by ALD. After providing the substrate in step 810, in step 820 the diffusion barrier film is deposited by ALD. Step 820 comprises a metal-containing reactant exposure step 822, a nitrogen-, carbon-, phosphorus- and/or boron-containing reactant exposure step 824 and a loop indicated by the repeat or proceed step 826 and dotted line 825. Steps 822 and 824 are repeated in sequence until the desired film thickness has been deposited. Although in step 820 it is shown that the ALD sequence starts with the metal-containing reactant exposure step and ends with the a nitrogen-, carbon-, phosphorus- or boron-containing reactant exposure step, it will be understood that the ALD sequence can start and end with either one of the steps 822 and 824. It will be understood that some reactants can include two or more of N, C, P and B, such that "or" is used in the inclusive sense in FIG. 8.

After completing the deposition of the diffusion barrier film by ALD, the substrate is exposed to a hydroxyl-containing reactant in step 830. Step 830 can be a single hydroxyl-containing reactant exposure step 834. Alternatively, step 830 can also be an ALD sequence for metal oxide deposition, comprising a metal-containing reactant exposure step 832 followed by a hydroxyl-containing reactant exposure step 834. Steps 832 and 834 are preferably repeated in sequence one to fifty times, more preferably 2 to 25 times, as indicated by loop 835, so as to deposit a monolayer of metal oxide or hydroxyl-terminated metal. Optionally, step 830 can start with a hydroxyl reactant step, not shown, and then followed by a repeated sequence of ALD deposition steps 832 and 834. Then, a metal film is deposited in step 850, preferably by CVD or ALD.

Figure 9:
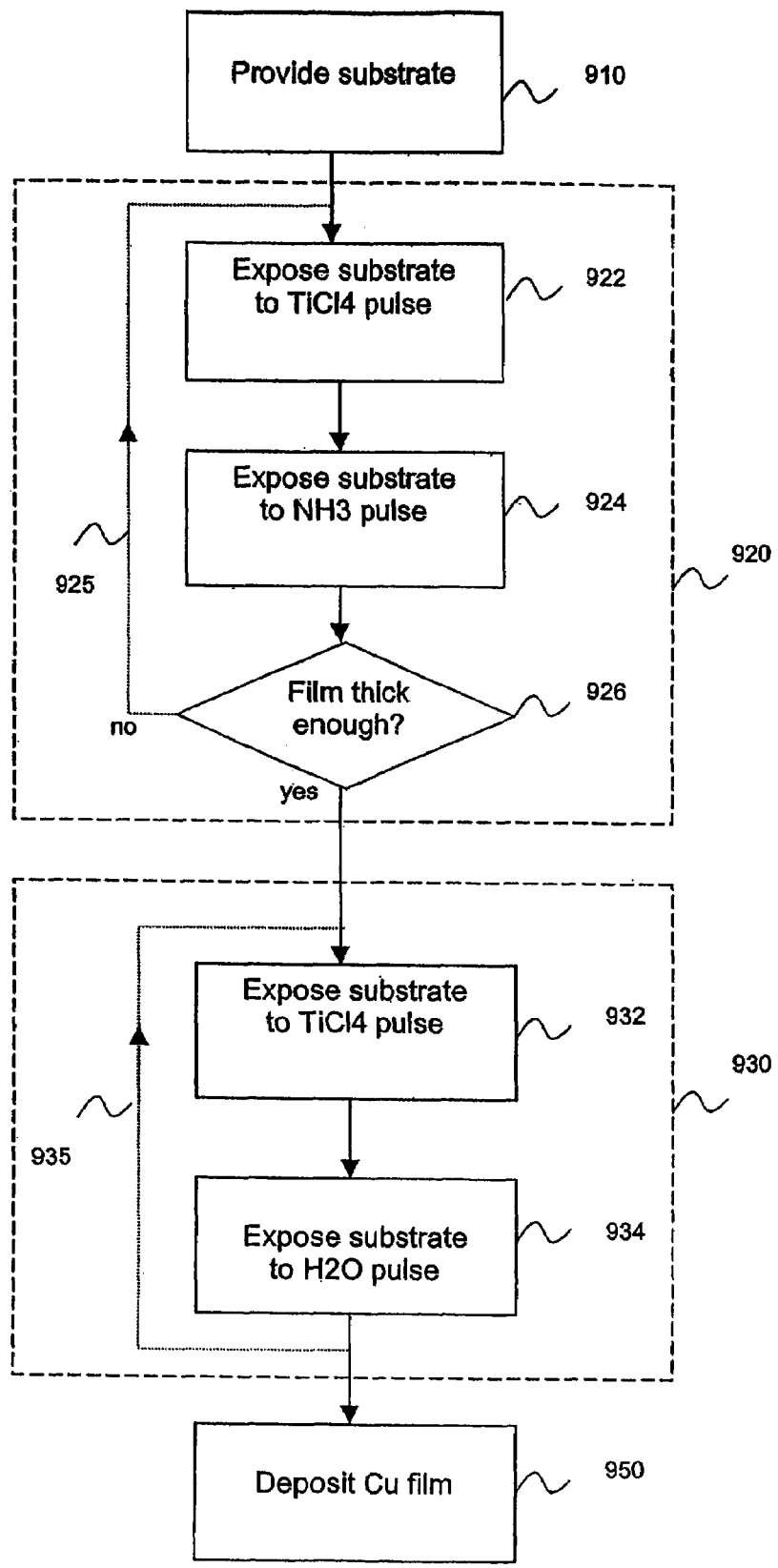

A specific example of the method according to FIG. 8 is shown in FIG. 9. In FIG. 9, a substrate is provided in step 910. A TiN diffusion barrier film is deposited by ALD in step 920. In step 920, the surface of the substrate is repeatedly and alternatingly exposed to pulses of TiCl$_4$ and NH$_3$, as indicated by TiCl$_4$ exposure step 922, NH$_3$ exposure step 924, repeat or proceed step 926 and loop 925. Although in step 920 the ALD sequence is shown to start with TiCl$_4$ exposure step 922 and to end with NH$_3$ exposure step 924, the sequence can start and end with either one of the steps. Between subsequent reactant pulses the reaction chamber is pumped down and/or purged to remove any excess reactant or reaction products before the next reactant pulse is admitted to the reaction chamber, which is generally true of all ALD steps described herein. When the target TiN film thickness is achieved, or a predefined number of cycles is performed, the process is concluded by hydroxyl exposure step 930. Step 930 comprises a TiCl$_4$ exposure step 932, followed by an H$_2$O exposure step 934. The H$_2$O exposure results in —OH termination of the surface.

As in most cases of ALD chemistries, less than a monolayer thickness is formed due to the size of the ligands (steric hindrance) and/or due to the limited number of reactive surface sites. As explained by Mikko Ritala and Markku Leskelä: "reasons for the less than a monolayer per cycle growth are the limited number of reactive surface sites and the steric hindrances between bulky ligands in the chemisorption layer. As a consequence, even if saturatively formed, the chemisorption layer contains too few metal atoms for forming a full monolayer of the film material." Ritala et al., *Handbook of Thin Film Materials, Vol.* 1: *Deposition and Processing of Thin Films* (2002), Chapter 2, Atomic Layer Deposition, p. 106. Accordingly, steps 932 and 934 are preferably repeated a number of times, preferably between one and fifty times and more preferably between 2 and 25 times, until about a monolayer of hydroxyl-terminated titanium oxide is formed. Then the substrate is ready to receive a copper film, so that at the interface the copper atoms are bonded to oxygen. In step 950, the copper film is preferably deposited by CVD or ALD.

It will be clear that the method according to the invention is not limited to the specific example of TiN deposition by TiCl$_4$ and NH$_3$. Other source materials for Ti or for other transition metals can be used. Similarly, other source materials for nitrogen or source materials for carbon, phosphorus or boron can be used.

According to yet another embodiment of the present invention, the bridge structure between the diffusion barrier and the metal or seed layer consists of anion groups (i.e., negatively charged molecules) that have oxygen as essential construction atoms and metals or non-metals as center atoms. In solid phase, anions tend to bond to the surrounding atoms via its oxygen atoms so that a neutral local structure is created. The preferred embodiments utilize molecular anions that have a suffix "-ate" in their names. There are many elements that form anions. According to the modern notation, the end of the element's name is changed to a suffix "-ate" and then the oxidation number is placed in brackets after the suffix. In the present case, the suffix "-ate" indicates that there are bonded oxygen atoms in the anion molecule. The benefit of these anions is that the anion molecule has a strong chemical bond to both a metal atom in the diffusion barrier and to a metal atom in the metal layer, so that an electrically neutral molecular bridge structure is formed.

For example, boron has several oxygen-rich anions, borate (III), $[BO_3]^{3-}$, serving as an example. The center atom, in this case boron B, is surrounded by and bonded to three oxygen atoms. When the interface of a diffusion barrier film and a metal film is provided with a borate bridge structure, at least one of said oxygen atoms further bonds to a metal in the diffusion barrier film and at least one other of said oxygen atoms further bonds to a metal in a metal film. A strong molecular bridge is thus formed between the diffusion barrier film and the metal film. Aluminum serves as an example of an element having both oxides, e.g., $Al_2O_3$, and metallate anions, e.g., aluminate (III) $[AlO_3]^{3-}$. Another example is silicon. It forms silicon oxide $SiO_2$ and silicates, e.g., ortho-silicate(IV) $[SiO_4]^{4-}$.

Figure 10:
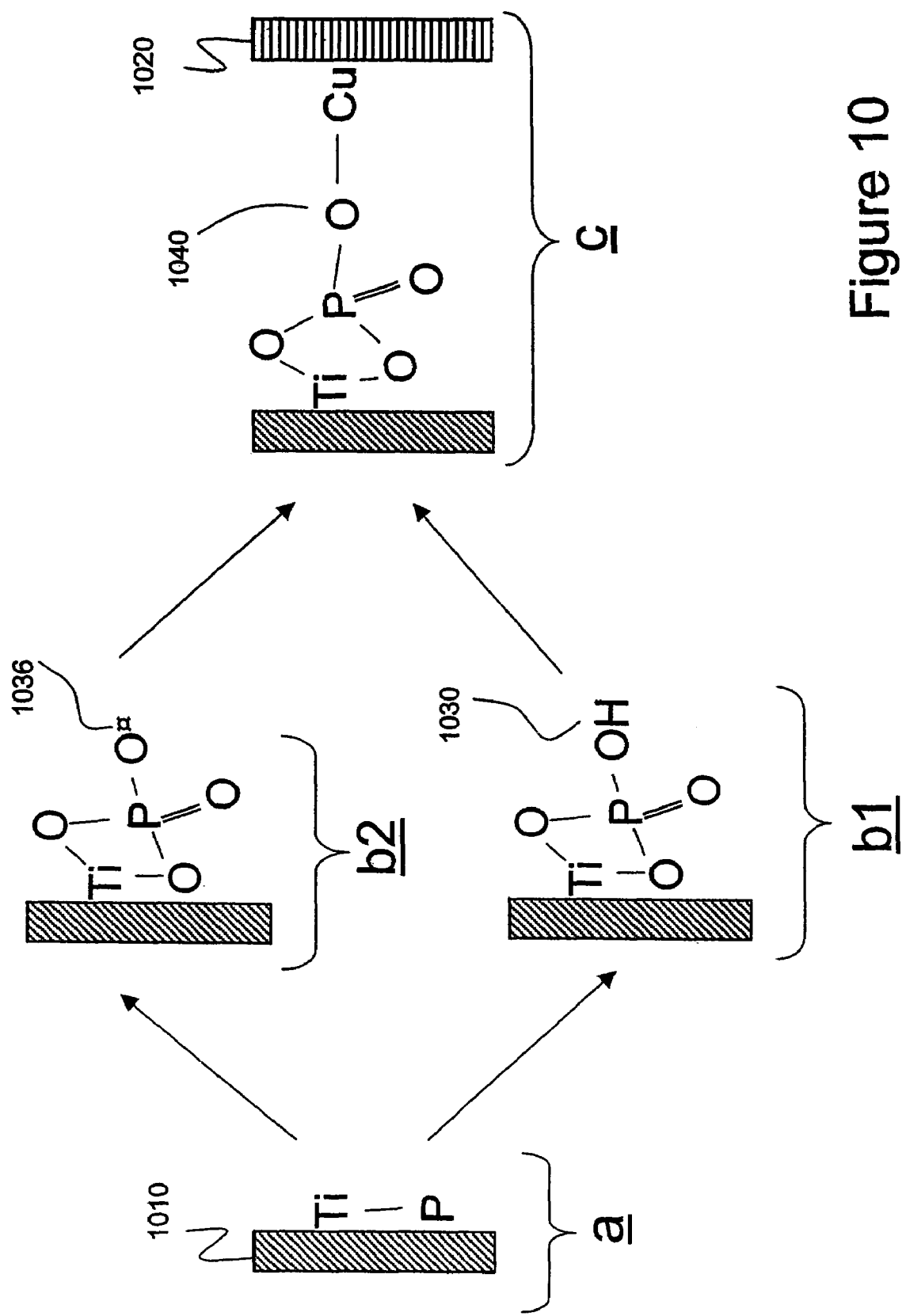
FIGS. 10 and 11 are schematic representations of surface chemistries in further embodiments of the invention.
Figure 11:
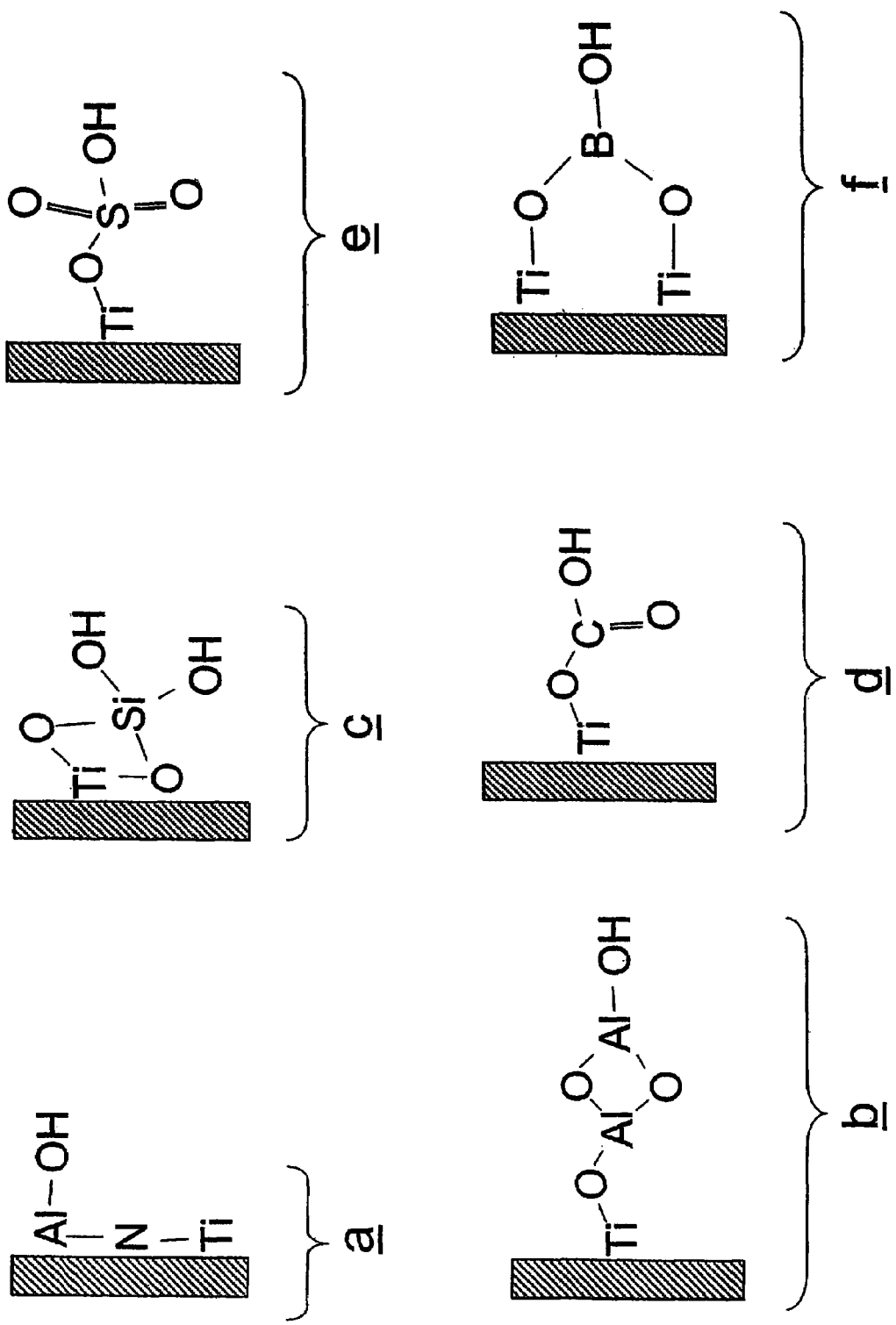

FIGS. 10 and 11 depict some of the possible bonding schemes. In FIG. 10 a the diffusion barrier 1010 comprises titanium phosphide TiP. The TiP surface can be exposed to an oxidizing source material, such as oxygen ($O_2$), ozone ($O_3$) and/or hydrogen peroxide ($H_2O_2$). The resulting titanium phosphate may have a hydroxyl group 1030 as shown in FIG. 10 b1 or an oxygen atom having a dangling bond 1036 as shown in FIG. 10 b2. An interfacial copper atom of the copper film 1020 forms a strong chemical bond to the phosphate group via an oxygen bridge 1040 as shown in FIG. 10 c.

It is also possible to form a phosphate surface by a two-step exposure process, wherein the TiP surface is first exposed to a phosphorus source chemical vapor, such as phosphorus pentoxide ($P_2O_5$), and then exposed to a hydroxyl-containing source chemical vapor, such as water ($H_2O$).

In FIG. 11 some other schemes are shown. In FIG. 11 a an aluminum atom is bonded to a nitrogen atom and a hydroxyl group. In this case the diffusion barrier may comprise titanium aluminum nitride and the surface has been treated, e.g., with water for creating the —OH groups. Another possibility is that a titanium nitride surface is first exposed to an aluminum source chemical, e.g., $AlCl_3$, and then the chloride-terminated surface is exposed to, e.g., water vapor and the surface is terminated with hydroxyl groups. A stronger oxidizing agent may form an aluminate on the surface as shown in FIG. 11 b. In this case titanium nitride surface is first exposed to aluminum alkoxide vapor, e.g., aluminum ethoxide, and then the surface is exposed to a strong oxidizing agent, e.g., ozone gas or ozone/water vapor mixture so that the surface becomes hydroxyl-terminated. In case ozone is used, the metal reactant chemisorbed on the diffusion barrier surface may form a metal oxide or a metallate, e.g., aluminate, while the bulky ligands of the metal reactant protect the diffusion barrier against extensive oxidation. A diffusion barrier consisting of titanium silicon nitride can be treated with an oxidizing agent, e.g., hydrogen peroxide vapor, so that a silicate surface with hydroxyl groups is created as shown in FIG. 11 c. When a metal carbide diffusion barrier is exposed to an oxidizing agent, e.g., ozone/water vapor mixture, carbonate groups can be formed as shown in FIG. 11 d. However, carbonates tend to decompose into solid oxides and carbon dioxide vapor at higher temperatures, so that, depending on the exposure temperature, the carbonate surface can evolve into an oxide- or hydroxyl-terminated surface. When a diffusion barrier surface is exposed to wet sulfur dioxide gas, it is possible to form sulfate groups that have some bonded hydrogen, as shown in FIG. 11 e. When a metal boride diffusion barrier is exposed to an oxidizing agent, e.g., wet ozone $O_3/H_2O$, borate group forms on the surface as shown in FIG. 11 f.

It should be noted that many elements of the periodic table of elements form metallate anions, and the presented cases in FIGS. 10 and 11 serve only as examples of those metallates.

ALD is the preferred method for growing the oxygen-rich anion layer onto the thin film surfaces, because said method provides means for controlling the layer thickness down to a uniform sub-molecular layer. Sub-molecular layer means that part of the surface is covered with oxygen-rich molecules and the rest of the surface is free of such oxygen-rich molecules. To get the strongest possible adhesion between the diffusion barrier and the metal layer, the bridge structures preferably consist of a molecular layer of single-oxygen bridges, a molecular metal oxide layer or a molecular metallate layer.

The element present in the metal oxide or the metallate is preferably selected from a group consisting of beryllium (Be), magnesium (Mg), calcium (Ca), strontium (Sr), barium (Ba), scandium (Sc), yttrium (Y), lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), lutetium (Lu), titanium (Ti), zirconium (Zr), hafnium (Hf), vanadium (V), niobium (Nb), tantalum (Ta), chromium (Cr), molybdenum (Mo), tungsten (W), manganese (Mn), rhenium (Re), iron (Fe), ruthenium (Ru), osmium (Os), cobalt (Co), nickel (Ni), copper (Cu), zinc (Zn), cadmium (Cd), boron (B), aluminum (Al), gallium (Ga), indium (In), carbon (C), silicon (Si), germanium (Ge), tin (Sn), lead (Pb), phosphorus (P), arsenic (As), antimony (Sb), bismuth (Bi), sulfur (S), selenium (Se) and tellurium (Te).

As is known in the art, it might be beneficial to perform the subsequent steps of the process sequences described above in-situ, that is, in a single reaction chamber, whenever applicable. Alternatively, the subsequent steps can be performed in different reaction chambers of a vacuum cluster system in order to avoid intermediate exposure to ambient air. For example, in the sequence of FIG. 9, the deposition of the TiN diffusion barrier by ALD through a repeating sequence of steps 922 and 924 can be carried out in-situ in a single reaction chamber. The subsequent metal reactant exposure step 932 and hydroxyl reactant exposure step 934 can also be carried out in the same ALD reaction chamber. The copper deposition of step 950, however, should be carried out in a separate reaction chamber, as the copper would contaminate the next wafer during loading and prior to deposition of the diffusion barrier. Alternatively, the metal reactant exposure step 932 and the hydroxyl reactant exposure step 934 can be carried out in a chamber dedicated for this purpose or these steps can be carried out in the copper deposition chamber. When different chambers are used, they are preferably connected through a vacuum cluster system.

When the deposition of the first film is not carried out in a cluster system together with the ALD of the metal oxide film, it might be necessary to perform a treatment of the first film surface, such as removing hydrocarbon contamination or removing uncontrolled amounts of native oxide, to create a well-defined starting point for further processing.

According to another embodiment of the present invention a molecular bridge structure is proposed, the bridge structure comprising a diffusion barrier film, a metal film and about a monolayer of oxygen-rich atomic or molecular layer at the interface of the diffusion barrier film and the metal film, the oxygen atoms forming bridges or being part of molecular bridges between diffusion barrier film atoms and a metal film atoms.

Figure 12:
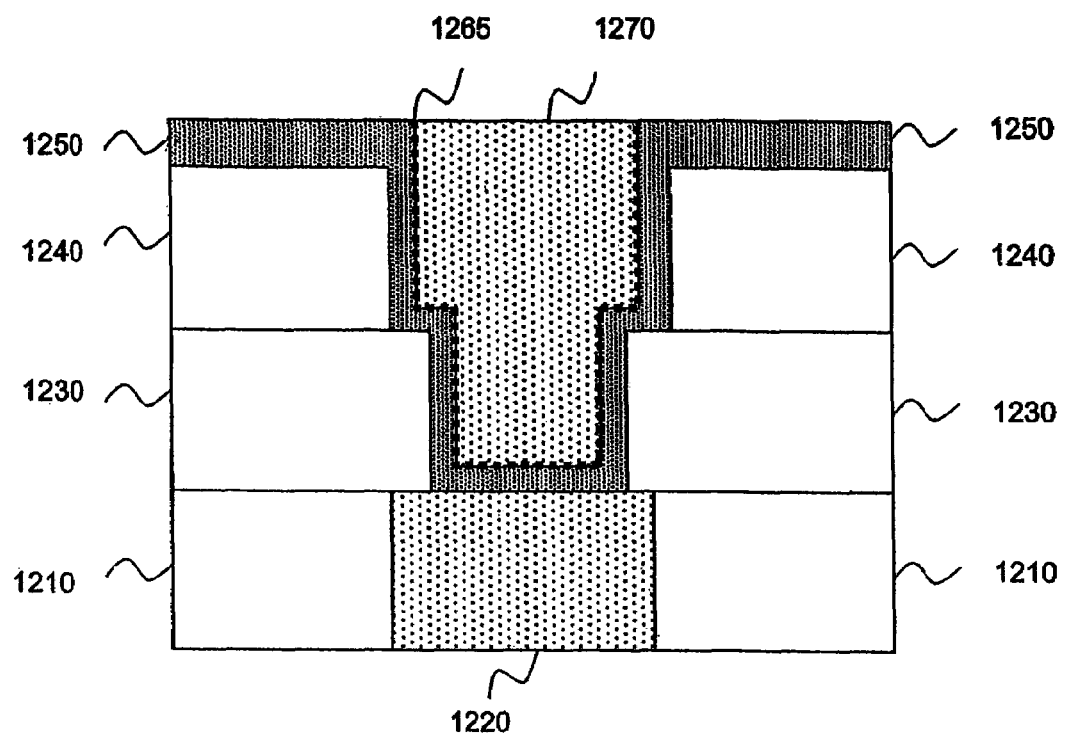
FIGS. 12 and 13 are examples of dual damascene structures comprising oxygen bridge structures in accordance with preferred embodiments of the invention.
Figure 13:
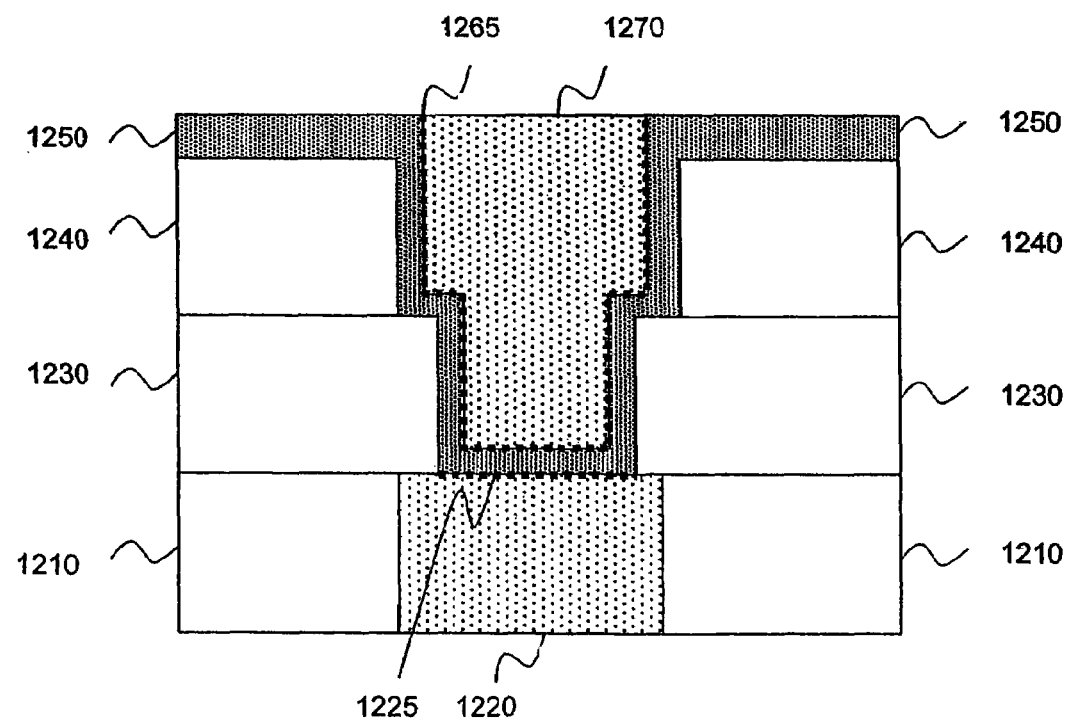

According to a specific embodiment of the present invention, a dual damascene structure is proposed, the dual damascene structure comprising one or more atomic bridge structures. Examples of dual damascene structures according to the invention are shown in FIGS. 12 and 13. A first dielectric film is indicated by 1210. The first dielectric film 1210 comprises trenches in which a first metal film 1220 is deposited. A second dielectric film 1230 comprises local contact holes and a third dielectric film 1240 comprises elongated trenches. A diffusion barrier film 1250 is deposited in the contact holes of the second dielectric layer 1230 and the trenches of the third dielectric layer 1240. A second metal film 1270 is deposited over the diffusion barrier film 1250 in the contact hole and the trench. An oxygen atomic bridge structure 1265 is present at the interface of the diffusion barrier film 1250 and the second metal film 1270. Preferred metal films are Cu, Al, Ni, Co or Ru films. Preferred diffusion barrier films comprise a transition metal nitride, -carbide, -phosphide, -boride, -nitride carbide such as $WN_xC_y$, or a transition metal. FIG. 13 shows a similar structure as FIG. 12 wherein like reference numerals refer to similar items. FIG. 13 shows a second atomic bridge structure 1225 at the interface between the first metal film 1220 and the diffusion barrier film 1250.

Although the foregoing invention has been described in terms of certain preferred embodiments, other embodiments will be apparent to those of ordinary skill in the art. For example, while illustrated in the context of ALD processing to create an oxygen bridge, either by mere surface termination or by additional metal oxide deposition, certain features and advantages of the embodiments described herein will have application to other methods of forming the desired oxygen bridge structure.

For example, a chemical oxide of controlled thickness can be formed by oxidizing the barrier surface, or the metal surface, depending upon the desired sequence, through an oxidation-moderating surface termination. The method described herein is generally more effective when oxidizing a metal surface. A surface termination that is larger than hydrogen or fluorine termination, and preferably larger than hydroxyl termination, is first applied to the surface to be oxidized. The surface termination is preferably provided through ALD techniques causing chemical adsorption (chemisorption) of this oxidation-moderating surface termination. Then, through careful selection of oxidant and conditions (e.g., temperature), the underlying surface is oxidized through the surface termination, without causing substantial desorption of the surface termination. Preferably the conditions are controlled to limit oxide growth to less than five monolayers of oxide bridge material, more preferably between about one monolayer and three monolayers. After oxidation (selected to balance minimal electrical resistance with substantial coverage for serving as a bond-improving oxide bridge), the surface termination can be desorbed and deposition of the other of the barrier and metal layers is conducted. Processes and further considerations for such controlled oxidation are described in more detail in U.S. patent application Ser. No. 09/791,167, filed Feb. 22, 2001 and entitled METHOD OF FORMING ULTRATHIN OXIDE LAYER, now U.S. Pat. No. 6,492,283, issued Dec. 10, 2002, the disclosure of which is incorporated herein by reference.

Additionally, other combinations, omissions, substitutions and modification will be apparent to the skilled artisan, in view of the disclosure herein. Accordingly, the present invention is not intended to be limited by the recitation of the preferred embodiments, but is instead to be defined by reference to the appended claims.

We claim:

1. A method for manufacturing a semiconductor device, the method comprising:

depositing a diffusion barrier film on a substrate;

depositing a metal film onto the substrate; and forming an oxygen bridge between the diffusion barrier and the metal film, wherein forming an oxygen bridge comprises exposing the substrate to an oxygen-containing reactant to create a surface termination on the metal film of about one monolayer of oxygen-containing groups or oxygen atoms.

2. A method for manufacturing a semiconductor device, the method comprising:

depositing a diffusion barrier film on a substrate;

depositing a metal film onto the substrate; and forming an oxygen bridge between the diffusion barrier and the metal film, wherein forming an oxygen bridge comprises exposing the substrate to a hydroxyl-containing reactant under atomic layer deposition (ALD) conditions to create a surface termination of about one monolayer of hydroxyl groups on the substrate surface.

3. The method of claim 2, wherein the step of exposing the substrate to a hydroxyl-containing reactant under ALD conditions comprises subjecting the substrate to a repeated and alternating sequence of a metal-containing reactant exposure step and a hydroxyl-containing reactant exposure step.

4. The method of claim 3, wherein the sequence is repeated from one to fifty times.

5. A method for manufacturing a semiconductor device, the method comprising:

depositing a diffusion barrier film on a substrate;

depositing a metal film onto the substrate; and forming an oxygen bridge between the diffusion barrier and the metal film, wherein forming an oxygen bridge comprises exposing the substrate to a hydroxyl-containing reactant to create a surface termination of about one monolayer of oxygen-containing groups or oxygen atoms on the substrate surface, and wherein the hydroxyl-containing reactant comprises at least one of methanol, ethanol, propanol, formic acid, and acetic acid.

* * * * *